(12) United States Patent
Gao et al.

(10) Patent No.: US 11,882,726 B2
(45) Date of Patent: Jan. 23, 2024

(54) OLED DISPLAY PANEL AND MANUFACTURING METHOD OF THE SAME

(71) Applicants: Chengdu BOE Optoelectronics Technology Co., Ltd., Sichuan (CN); BOE TECHNOLOGY GROUP CO., LTD., Beijing (CN)

(72) Inventors: Hongcheng Gao, Beijing (CN); Ao Huang, Beijing (CN); Can Huang, Beijing (CN); Jiandong Bao, Beijing (CN); Jiwei Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 17/771,956

(22) PCT Filed: Jun. 23, 2021

(86) PCT No.: PCT/CN2021/101734
§ 371 (c)(1),
(2) Date: Apr. 26, 2022

(87) PCT Pub. No.: WO2021/259308
PCT Pub. Date: Dec. 30, 2021

(65) Prior Publication Data
US 2022/0376215 A1 Nov. 24, 2022

(30) Foreign Application Priority Data
Jun. 23, 2020 (CN) .......................... 202010580971.3

(51) Int. Cl.
*G06K 9/00* (2022.01)
*H10K 50/86* (2023.01)
(Continued)

(52) U.S. Cl.
CPC ....... *H10K 50/865* (2023.02); *G06V 40/1318* (2022.01); *H10K 59/38* (2023.02); *H10K 59/65* (2023.02); *H10K 71/00* (2023.02)

(58) Field of Classification Search
CPC ...... H10K 50/865; H10K 71/00; H10K 59/38; H10K 59/65; H10K 59/22; H10K 77/111; G06V 40/1318
See application file for complete search history.

(56) References Cited

U.S. PATENT DOCUMENTS

| 10,566,578 B2 | 2/2020 | Sakamoto et al. |
| 2010/0026178 A1 | 2/2010 | Hwang et al. |

(Continued)

FOREIGN PATENT DOCUMENTS

| CN | 105789479 A | 7/2016 |
| CN | 108598109 A | 9/2018 |

(Continued)

OTHER PUBLICATIONS

China Patent Office, First Office Action dated Feb. 28, 2022, for corresponding Chinese application 202010580971.3.

(Continued)

*Primary Examiner* — Abdul-Samad A Adediran
(74) *Attorney, Agent, or Firm* — HOUTTEMAN LAW LLC

(57) ABSTRACT

An OLED display panel and a manufacturing method of the same are provided. The OLED display panel includes a base plate, a first electrode layer and a pixel definition layer on a first side of the base plate, a plurality of electroluminescent layers on the first electrode layer, a second electrode layer covering the pixel definition layer and the plurality of electroluminescent layers, an encapsulation layer covering the second electrode layer, a black matrix and a color filter layer on the encapsulation layer and a plurality of photo- (Continued)

sensitive fingerprint sensors on a second side of the base plate; a plurality of light-transmitting holes are arranged in the black matrix, and orthographic projections of the plurality of light-transmitting holes on the second electrode layer are in hollow-out regions of the second electrode layer, respectively; and the photosensitive fingerprint sensors are in the orthographic projections of the light-transmitting holes, respectively.

15 Claims, 9 Drawing Sheets

(51) Int. Cl.
*G06V 40/13* (2022.01)
*H10K 59/38* (2023.01)
*H10K 71/00* (2023.01)
*H10K 59/65* (2023.01)

(56) References Cited

U.S. PATENT DOCUMENTS

| 2018/0190933 | A1  | 7/2018  | Zhang et al. |
| 2019/0088904 | A1* | 3/2019  | Cho ................... H10K 59/122 |
| 2021/0028252 | A1* | 1/2021  | Hong .................. H10K 77/111 |
| 2021/0359010 | A1* | 11/2021 | Kang .................... H10K 71/00 |
| 2021/0397806 | A1* | 12/2021 | Lu ......................... H10K 59/65 |

FOREIGN PATENT DOCUMENTS

| CN | 110970480 A  | 4/2020 |
| CN | 111312792 A  | 6/2020 |
| CN | 111668388 A  | 9/2020 |
| JP | 2017174553 A | 9/2017 |

OTHER PUBLICATIONS

China Patent Office, rejection dated Aug. 2, 2022, for corresponding Chinese application 202010580971.3.

\* cited by examiner

OLED DISPLAY PANEL AND MANUFACTURING METHOD OF THE SAME

CROSS-REFERENCE TO RELATED APPLICATION

The present disclosure claims the priority of the Chinese Patent Application No. 202010580971.3, filed with the Chinese Patent Office on Jun. 23, 2020, the entire contents of which are incorporated herein by reference.

TECHNICAL FIELD

The present disclosure relates to the field of display technology, and in particular, to an organic light-emitting diode (OLED) display panel and a manufacturing method of the same.

BACKGROUND

With the development of terminal technology, screens of electronic apparatuses are becoming increasingly large in size, and electronic apparatuses with high screen-to-body ratios are gradually gaining popularity among customers. As the goal for the development of the electronic apparatuses with high screen-to-body ratios, full-screen electronic apparatuses realize the maximization of the screen-to-body ratios of the electronic apparatuses, and are well received and highly sought after by the customers; and the technology for the full-screen electronic apparatuses ranks among the hottest technologies at present.

SUMMARY

The present disclosure provides an OLED display panel and a manufacturing method of the same.

The OLED display panel of the present disclosure includes a base plate; an OLED device layer which is arranged on a first side of the base plate and includes a plurality of OLED light-emitting devices; an encapsulation layer which covers the plurality of OLED light-emitting devices; and a color filter layer which is arranged on the encapsulation layer and includes: a black matrix defining a plurality of openings, and a plurality of color filters situated in the plurality of openings, respectively, spaced apart from one another by the black matrix and corresponding to the plurality of OLED light-emitting devices, respectively, wherein the OLED device layer includes a first electrode layer, a plurality of electroluminescent layers of the plurality of OLED light-emitting devices on the first electrode layer, and a second electrode layer covering the plurality of electroluminescent layers, and wherein the encapsulation layer is formed on the second electrode layer. The OLED display panel further includes a plurality of photosensitive fingerprint sensors arranged on a second side of the base plate opposite to the first side of the base plate. A plurality of light-transmitting holes are arranged in the black matrix, the second electrode layer has a plurality of second hollow-out regions, and respective orthographic projections of the plurality of light-transmitting holes, the plurality of second hollow-out regions and the plurality of photosensitive fingerprint sensors on the base plate at least partially overlap with one another.

In some embodiments, the OLED device layer further includes a pixel definition layer defining a plurality of sub-pixel regions of the plurality of OLED light-emitting devices and exposing the first electrode layer, and respective orthographic projections of the plurality of second hollow-out regions on the base plate are in a range of an orthographic projection of the pixel definition layer on the base plate.

In some embodiments, a material of the second electrode layer is magnesium, aluminum and an alloy of magnesium and aluminum; and the OLED device layer further includes a plurality of transparent organic material layers which are arranged in the plurality of second hollow-out regions of the second electrode layer.

In some embodiments, respective orthographic projections of the plurality of transparent organic material layers on the base plate coincide with the respective orthographic projections of the plurality of second hollow-out regions on the base plate.

In some embodiments, the first electrode layer includes a plurality of discrete first electrodes of the plurality of OLED light-emitting devices; and the second electrode layer includes a one-piece second electrode for the plurality of OLED light-emitting devices, and the plurality of second hollow-out regions are a plurality of openings arranged in the second electrode layer.

In some embodiments, the first electrode layer has a plurality of first hollow-out regions, and respective orthographic projections of the plurality of light-transmitting holes, the plurality of second hollow-out regions, the plurality of first hollow-out regions and the plurality of photosensitive fingerprint sensors on the base plate at least partially overlap with one another.

In some embodiments, the OLED display panel further includes an over-coating layer which covers the color filter layer.

In some embodiments, a material of the first electrode layer includes a light-blocking and conductive material.

In some embodiments, the color filter layer includes a plurality of red color filters, a plurality of green color filters and a plurality of blue color filters which are arranged in an array.

A manufacturing method of an OLED display panel provided in the present disclosure includes: forming, on a first side of a base plate, an OLED device layer which has a plurality of OLED light-emitting devices and includes a first electrode layer, a plurality of electroluminescent layers of the plurality of OLED light-emitting devices on the first electrode layer and a second electrode layer on the plurality of electroluminescent layers, wherein the second electrode layer has a plurality of second hollow-out regions; encapsulating the first side of the base plate to cover the plurality of OLED light-emitting devices so as to form an encapsulation layer; forming, on the encapsulation layer, a color filter layer which includes a black matrix defining a plurality of openings and a plurality of color filters in the plurality of openings, respectively, spaced apart from one another by the black matrix and corresponding to the plurality of OLED light-emitting devices, respectively, wherein a plurality of light-transmitting holes are arranged in the black matrix; and forming a plurality of photosensitive fingerprint sensors on a second side of the base plate, wherein respective orthographic projections of the plurality of light-transmitting holes, the plurality of second hollow-out regions and the plurality of photosensitive fingerprint sensors on the base plate at least partially overlap with one another.

In some embodiments, the forming the OLED device layer on the first side of the base plate includes: forming, on the base plate, the first electrode layer which includes a plurality of discrete first electrodes for the plurality of OLED light-emitting devices; forming, on the plurality of discrete first electrodes, a pixel definition layer to define a plurality of sub-pixel regions of the plurality of OLED light-emitting devices and expose the plurality of discrete first electrodes; forming the plurality of electroluminescent layers on the plurality of discrete first electrodes; and forming the second electrode layer on the pixel definition layer and the plurality of electroluminescent layers, respective orthographic projections of the plurality of second hollow-out regions of the second electrode layer on the base plate being in a range of an orthographic projection of a pixel definition layer on the base plate.

In some embodiments, the forming the second electrode layer on the pixel definition layer and the plurality of electroluminescent layers includes: forming a plurality of transparent organic material layers at respective positions corresponding to the plurality of second hollow-out regions on the pixel definition layer; and forming a second electrode material layer on the pixel definition layer and the plurality of electroluminescent layers so as to form the second electrode layer which includes the plurality of transparent organic material layers at the respective positions corresponding to the plurality of second hollow-out regions and a second electrode material outside the respective positions corresponding to the plurality of second hollow-out regions.

In some embodiments, the forming the first electrode layer on the base plate includes forming the first electrode layer having a plurality of first hollow-out regions, such that respective orthographic projections of the plurality of light-transmitting holes, the plurality of second hollow-out regions, the plurality of first hollow-out regions and the plurality of photosensitive fingerprint sensors on the base plate at least partially overlap with one another.

In some embodiments, after the forming the color filter layer on the encapsulation layer, the manufacturing method further includes forming an over-coating layer on the color filter layer.

BRIEF DESCRIPTION OF THE DRAWINGS

Advantages and merits of the present disclosure will become apparent to a person skilled in the art with reference to embodiments to be described in detail hereinafter. The drawings are solely for the purposes of illustration, and shall not be construed as limiting the present disclosure. Throughout the drawings of the present disclosure, same reference signs refer to same components.

Figure 1:
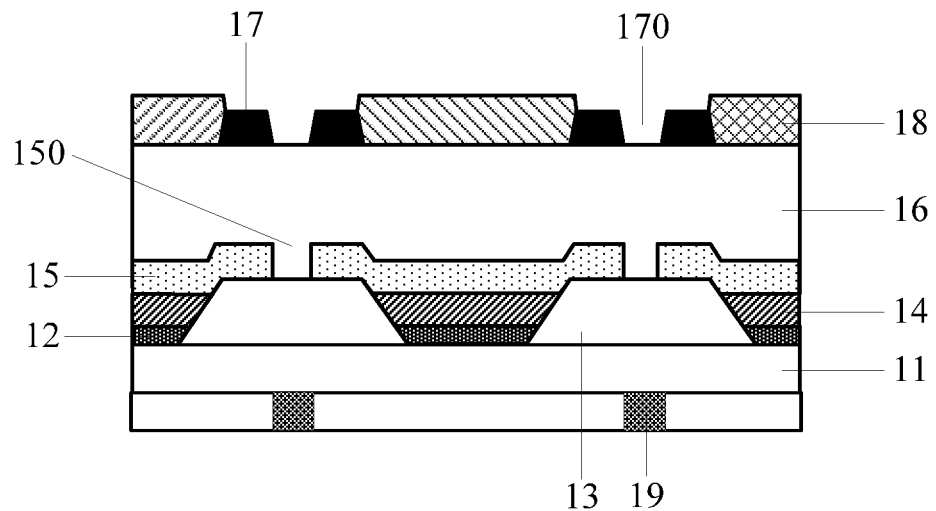
FIG. 1 is a cross-sectional view of an OLED display panel provided in some embodiments of the present disclosure.

REFERENCE SIGNS 11. base plate; 12. first electrode layer; 13. pixel definition layer; 14. electroluminescent layer; 15. second electrode layer; 16. encapsulation layer; 17. black matrix; 18. color filter layer; 19. photosensitive fingerprint sensor; 31. transparent organic material layer; 71. over-coating layer; 170. light-transmitting hole; 150. hollow-out region in the second electrode layer 15; 120. hollow-out region in first electrode layer 12; 181. red color filter; 182. green color filter; and 183. blue color filter.

DETAILED DESCRIPTION OF THE EXEMPLARY EMBODIMENTS

The technical solutions in the embodiments of the present disclosure will be described in a clearly and fully understandable way in conjunction with the accompanying drawings related to the embodiments. Apparently, the embodiments to be described hereinafter are just a part, but not all, of the embodiments of the present disclosure. All other embodiments obtained by a person skilled in the art based on the embodiments of the present disclosure without creative efforts shall fall within the protection scope of the present disclosure.

In the embodiments of the present disclosure, the term such as "exemplary" or "for example" is used to mean an example, instance, or illustration. Any embodiment or design described herein using the term such as "exemplary"

or "for example" shall not be construed as being preferred or advantageous over other embodiments or designs. Rather, the use of the term such as "exemplary" or "for example" is intended to present concepts in a concrete fashion. Moreover, unless otherwise specified, "plural" or "a plurality of" means two or more in the embodiments to be described hereinafter.

In order to retain a fingerprint collection module in a display panel of an electronic apparatus while preventing it from affecting the screen-to-body ratio of the electronic apparatus, the prior art proposes using an under-screen fingerprint recognition method to realize fingerprint recognition function. Since the under-screen fingerprint recognition method can enable the fingerprint collection module to be integrated into the display panel without occupying a display region of the display panel in comparison to traditional fingerprint recognition modules, it has become a major method to realize fingerprint recognition. However, when under-screen fingerprint recognition technology is applied to an OLED based on a Color-on-Encapsulation (COE) process (that is, a color filter (CF) layer is formed on top of the organic electroluminescent (EL) device encapsulated with a thin film), since light is blocked by a black matrix (BM), the color filter layer and electrode layers, light transmittance of the OLED based on the COE process is too low to reach the level required by the under-screen fingerprint recognition. In the prior art, the light transmittance of the OLED based on the COE process is usually increased by forming holes in the black matrix. However, the electrode layers of the OLED still affect the light transmittance, which in turn affects the accuracy of fingerprint collection; moreover, an electrode layer of the OLED is directly exposed due to the holes in the black matrix, which causes a great increase in the intensity of reflected light at these holes and therefore affects the display effect of the OLED.

Embodiments of the present disclosure provide an OLED display panel. Referring to FIG. 1, the OLED display panel provided in some embodiments of the present disclosure includes a base plate (BP) 11, a first electrode layer 12 and a pixel definition layer (PDL) 13 arranged on a first side of the base plate 11, a plurality of electroluminescent (EL) layers 14 arranged on the first electrode layer 12, a second electrode layer 15 covering the pixel definition layer 13 and the plurality of electroluminescent layers 14, an encapsulation (EN) layer 16 covering the second electrode layer 15, a black matrix (BM) 17 and a color filter (CF) layer 18 arranged on the encapsulation (EN) layer 16, and a plurality of photosensitive fingerprint sensors 19 arranged on a second side of the base plate 11.

A plurality of light-transmitting holes 170 (e.g., a plurality of openings arranged in the black matrix 17, which may also be referred to as a plurality light-transmitting openings herein) are arranged in the black matrix 17, the second electrode layer 15 has a plurality of second hollow-out regions 150, and orthographic projections of the plurality of light-transmitting holes 170 on the second electrode layer 15 are in the plurality of second hollow-out regions 150, respectively; and the plurality of photosensitive fingerprint sensors 19 are in the orthographic projections of the plurality of light-transmitting holes 170, respectively. For example, respective orthographic projections of the plurality of light-transmitting holes 170, the plurality of second hollow-out regions 150 and the plurality of photosensitive fingerprint sensors 19 on the base plate 11 at least partially overlap with one another, such that light reflected back from the first side of the OLED display panel may be incident on the plurality of photosensitive fingerprint sensors 19 with a relatively small loss. The plurality of second hollow-out regions 150 in the second electrode layer 15 may be a plurality of openings formed therein, which may also be referred to as a plurality of electrode openings herein; alternatively, these regions may be occupied by a plurality of transparent material layers, such as a plurality of transparent organic material layers, whose light transmittance is greater than that of other regions in the second electrode layer 15.

Electrodes included in the first electrode layer 12 in some embodiments of the present disclosure may be anodes or cathodes of the OLEDs. If the first electrode layer 12 includes the anodes of the OLEDs, the second electrode layer 15 includes the cathodes thereof; and if the first electrode layer 12 includes the cathodes of the OLEDs, the second electrode layer 15 includes the anodes thereof.

Moreover, the OLED display panel provided in some embodiments of the present disclosure may further include a fingerprint processing module electrically connected to each of the plurality of photosensitive fingerprint sensors 19 which convert light rays reflected by a finger into electrical signals and then output them, and the fingerprint processing module is configured to determine the collected fingerprint according to the electrical signals outputted by these sensors and match the collected fingerprint against fingerprints stored in advance.

Figure 2:
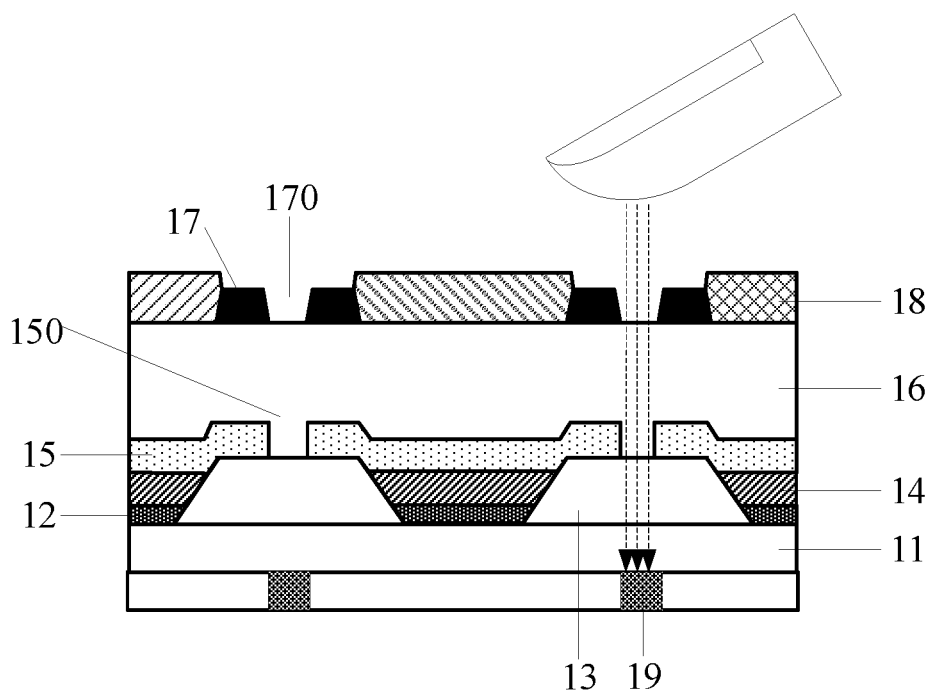
FIG. 2 is a diagram showing a working principle of an OLED display panel provided in some embodiments of the present disclosure.

As shown in FIG. 2, after the light rays reflected by the finger enter the OLED display panel via the light-transmitting holes 170 arranged in the black matrix 17, they first pass through the encapsulation layer 16, then enter the pixel definition layer 13 via the second hollow-out regions 150 in the second electrode layer 15, and finally pass through the pixel definition layer 13 to reach the photosensitive fingerprint sensors 19. During the transmission of the light rays reflected by the finger to the photosensitive fingerprint sensors 19, the light rays can pass through the second electrode layer 15 via the second hollow-out regions 150 therein, and therefore, the second electrode layer 15 does not absorb and reflect the light rays. For that reason, the embodiments of the present application can prevent the second electrode layer 15 from affecting the light transmittance of the OLEDs while avoiding the great increase in the intensity of reflected light at the light-transmitting holes in the black matrix.

An OLED display panel provided in some embodiments of the present disclosure includes: a base plate, a first electrode layer and a pixel definition layer arranged on a first side of the base plate, a plurality of electroluminescent layers arranged on the first electrode layer, a second electrode layer covering the pixel definition layer and the plurality of electroluminescent layers (that is, an OLED device layer including a plurality of OLED light-emitting devices is formed on the base plate), an encapsulation layer covering the second electrode layer, a color filter layer arranged on the encapsulation layer and including a black matrix, and a plurality of photosensitive fingerprint sensors arranged on a second side of the base plate, wherein the black matrix includes a black matrix defining a plurality of openings and a plurality of color filters are in the plurality of openings, respectively, spaced apart from one another by the black matrix and corresponding to the plurality of OLED light-emitting devices, respectively. On the basis of the foregoing, the black matrix is provided with a plurality of light-transmitting holes. The second electrode layer has a plurality of second hollow-out regions, and orthographic projections of the plurality of light-transmitting holes on the second electrode layer at least partially overlap with the plurality of second hollow-out regions in second electrode layer, respectively. For example, orthographic projections of the plurality of light-transmitting holes on the second electrode layer are in the plurality of second hollow-out regions in second electrode layer, respectively, and therefore, almost all the light rays incident from the light-transmitting holes are received by the plurality of photosensitive fingerprint sensors via the plurality of second hollow-out regions; and the plurality of photosensitive fingerprint sensors are in the orthographic projections of the plurality of light-transmitting holes, respectively, such that all the light rays reflected back through the plurality of light-transmitting holes are collected by the plurality of photosensitive fingerprint sensors. Since the plurality of second hollow-out regions are arranged in the second electrode layer, and the orthographic projections of the plurality of light-transmitting holes arranged in the black matrix on the second electrode layer are in the plurality of second hollow-out regions in second electrode layer, respectively, the light rays reflected by the finger will not be blocked by the black matrix and the second electrode layer, and accordingly, the embodiments of the present disclosure can increase the light transmittance of the OLEDs based the COE process. Furthermore, since the orthographic projections of the plurality of light-transmitting holes arranged in the black matrix on the second electrode layer are in the plurality of second hollow-out regions in the second electrode layer, respectively, the second electrode layer will not reflect the light rays transmitted through the plurality of light-transmitting holes, and accordingly, the embodiments of the present disclosure can avoid the great increase in the intensity of the reflected light at the plurality of light-transmitting holes. To sum up, the embodiments of the present disclosure can increase the light transmittance of the OLEDs based on the COE process while avoiding affecting the display effect.

As an alternative way to implement the embodiments of the present disclosure, a material for forming the second electrode layer may be magnesium (Mg), aluminum (Al) or their alloy; and the OLED light-emitting devices further include a plurality of transparent organic material layers 31, respectively. The transparent organic material layer 31, for example, may be a weak bonding layer (WBL). A pattern of the plurality of transparent organic material layers is complementary to the plurality of second hollow-out regions in the second electrode layer, and is on the pixel definition layer. For example, for the display panel including the plurality of OLED light-emitting devices, the second electrode layer for the plurality of OLED light-emitting devices is of a one-piece structure, and the plurality of second hollow-out regions in the second electrode layer coincide with orthographic projections of the plurality of transparent organic material layers on the base plate 11, respectively. That is, the plurality of transparent organic material layers will fill the plurality of second hollow-out regions. A bonding force between the plurality of transparent organic material layers and the pixel definition layer is relatively strong, while a bonding force between these layers and a metal material serving as pixel electrodes of the OLEDs is relatively weak, and therefore, during the formation of the metal material of the second electrode layer, the metal material can be prevented from being formed in the second hollow-out regions so as to ensure that the second hollow-out regions on the pixel definition layer do not contain the material such as Mg, AL or their alloy, which would otherwise block the light rays incident from the corresponding light-transmitting holes.

Figure 3:
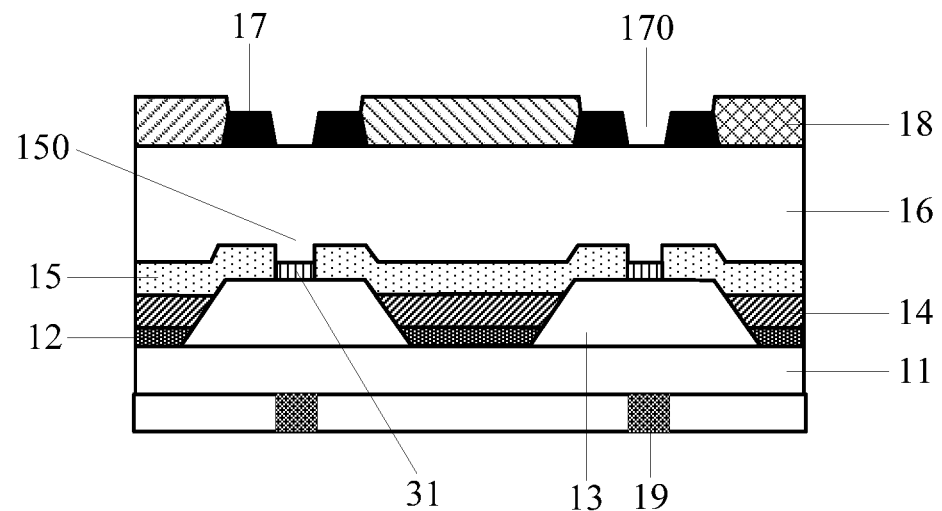
FIG. 3 is a cross-sectional view of an OLED display panel provided in some embodiments of the present disclosure.
Figure 4:
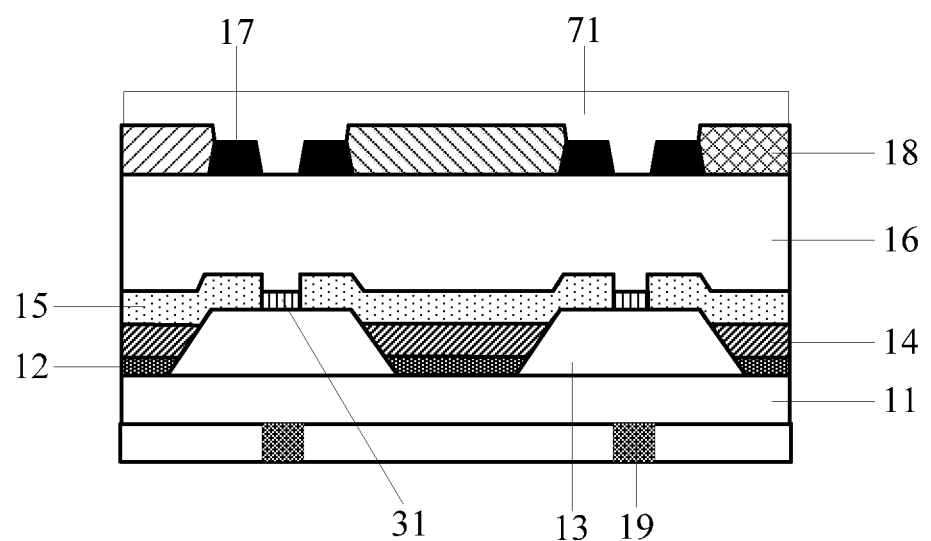
FIG. 4 is a cross-sectional view of an OLED display panel provided in some embodiments of the present disclosure.
Figure 5:
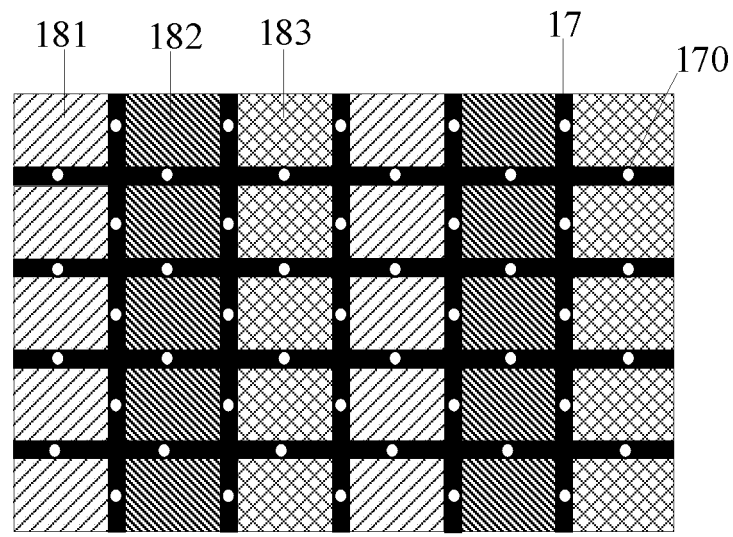
FIG. 5 is a top view of a color filter layer of an OLED display panel provided in some embodiments of the present disclosure.
Figure 6A:
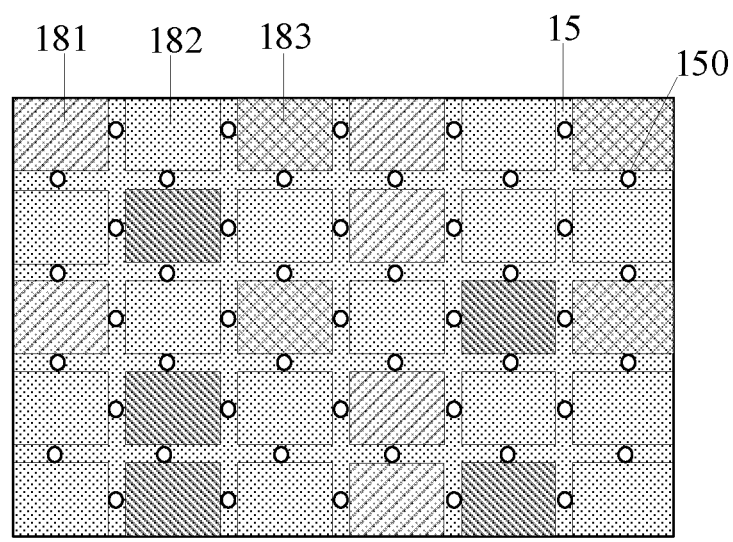
FIG. 6A is a top view of a second electrode layer of an OLED display panel provided in some embodiments of the present disclosure.

Specifically, FIG. 3 shows a cross section of the OLED display panel with the plurality of transparent organic material layers 31 formed in the second electrode layer 15; FIG. 4 shows a cross section of the OLED display panel including an over-coating layer 71; FIG. 5 shows a top view of the color filter layer including the black matrix with the plurality of light-transmitting holes 170; FIG. 6A shows a top view of the second electrode layer 15 provided with the plurality of second hollow-out regions 150 corresponding to the plurality of light-transmitting holes 170 in the black matrix, respectively; and FIG. 6B shows a top view of the second electrode layer 15 provided with the plurality of transparent organic material layers 31 in the plurality of second hollow-out regions 150 and corresponding to the plurality of light-transmitting holes 170 in the black matrix, respectively.

Figure 6B:
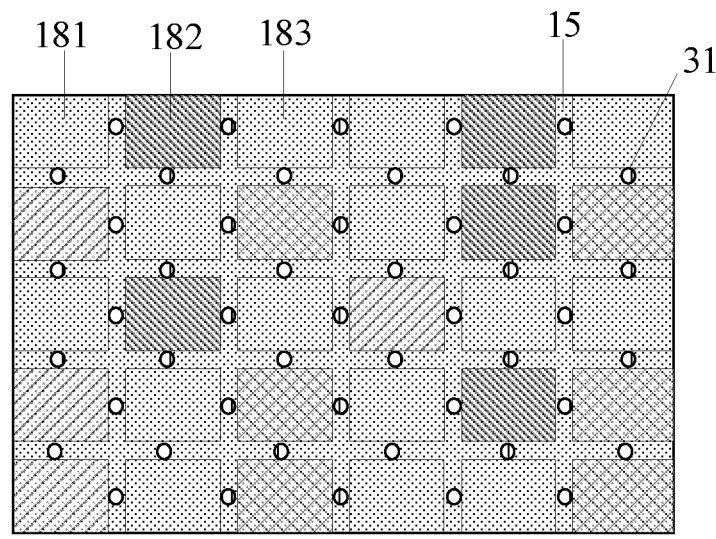
FIG. 6B is a top view of a second electrode layer of an OLED display panel provided in some embodiments of the present disclosure.

As shown in FIG. 6B, a pattern of the plurality of transparent organic material layers 31 is complementary to the plurality of second hollow-out regions 150 in the second electrode layer 15 (that is, the orthographic projections of the plurality of transparent organic material layers 31 on the base plate 11 coincide with those of the plurality of second hollow-out regions 150 thereon, respectively), and the plurality of transparent organic material layers 31 are on the pixel definition layer 13.

Since the transparent organic material layers 31 have higher light transmittance and lower light reflectance than those of the second electrode layer 15, they exert little influence on the light transmittance of the OLEDs as well as the intensity of the reflected light at the light-transmitting holes 170 in the black matrix, and therefore, when the transparent organic material layers 31 are incorporated into the OLED display panel, both the accuracy of the fingerprint collection and the display effect of the OLED display panel are within an acceptable range.

Furthermore, in a manufacturing process of the OLED display panel, the second electrode layer 15 is typically formed by an evaporation process. However, the second electrode layer thus formed is typically a continuous layer, and it is difficult to form the desired hollow-out regions during the evaporation. Therefore, after the formation of the second electrode layer 15 by the evaporation process, the hollow-out regions have to be further formed in the second electrode layer 15, which makes the process complex and raises the production cost. According to one embodiment of the present disclosure, the transparent organic material layers 31 are formed at the second hollow-out regions 150 of the second electrode layer 15, and thereafter, the metal material of the second electrode layer 15 is evaporated; since the metal material of the second electrode layer 15 does not adhere to the transparent organic material layers 31 (which, for example, may be made of an organic material with relatively low attraction to the metal material), the desired pattern of the second electrode layer including the plurality of second hollow-out regions may be directly formed, which can lower the complexity of forming the second electrode layer and hence the production cost of the OLED display panel.

Figure 7:
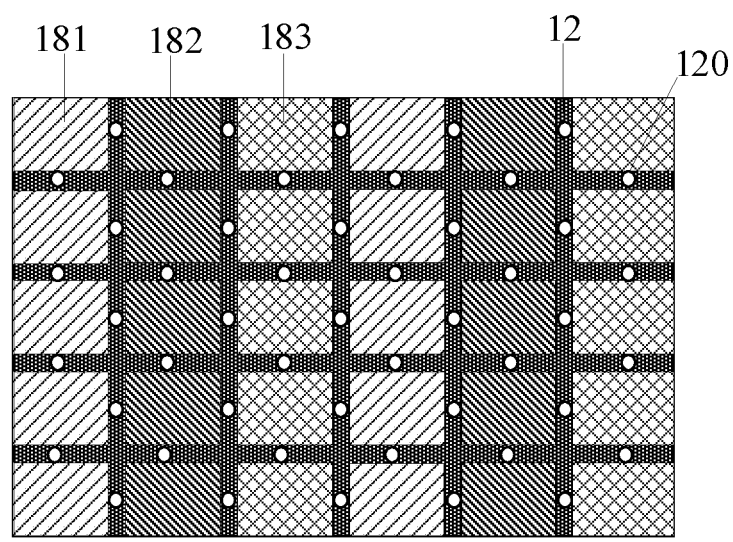
FIG. 7 is a top view of a first electrode layer of an OLED display panel provided in some embodiments of the present disclosure.

Referring to FIG. 7, in one embodiment, a plurality of first hollow-out regions 120 may be arranged in a first electrode layer 12 in a manner similar to the arrangement of the plurality of second hollow-out regions 150 in the second electrode layer 15 shown in FIG. 6A, such that the orthographic projections of the plurality of light-transmitting holes 170 on the first electrode layer 12 are situated in the plurality of first hollow-out regions 120 in the first electrode layer 12, respectively.

Figure 8A:
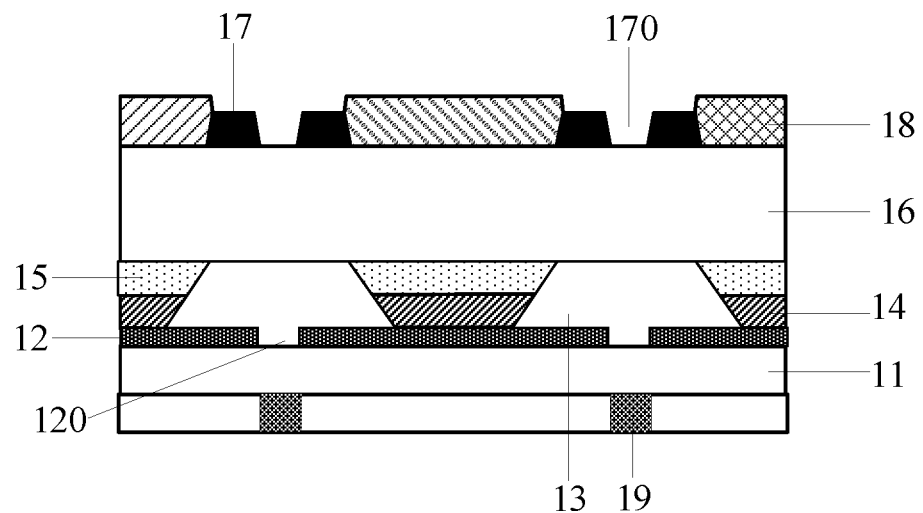
FIG. 8A is a cross-sectional view of an OLED display panel provided in some embodiments of the present disclosure.
Figure 8B:
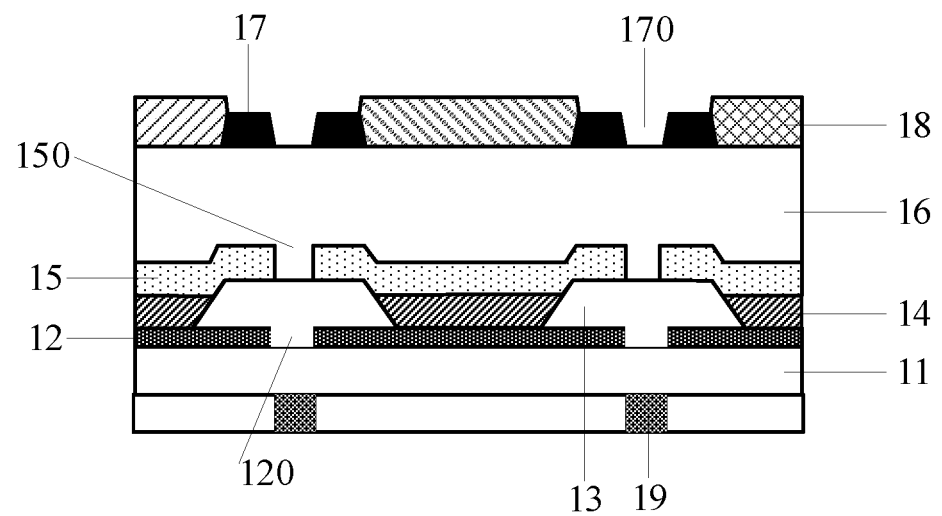
FIG. 8B is a cross-sectional view of an OLED display panel provided in some embodiments of the present disclosure.

Since the orthographic projections of the light-transmitting holes 170 on the first electrode layer 12 are situated in the first hollow-out regions 120 in the first electrode layer 12, respectively, the light rays reflected by the finger may pass through the first electrode layer 12 via the first hollow-out regions 120 therein, and therefore, the first electrode layer 12 does not absorb and reflect the light rays reflected by the finger. For that reason, the embodiment of the present disclosure can prevent the first electrode layer from affecting the light transmittance of the OLEDs. For example, the OLED display panel shown in FIG. 8A may be manufactured in the manner as described above, and in this OLED display panel, respective first electrodes (e.g., anodes) of the plurality of OLED light-emitting devices may be formed as one piece, that is, the plurality of first hollow-out regions 120 are arranged in the first electrode layer 12 of a one-piece structure to allow transmission of the light incident from the plurality of light-transmitting holes 170. Then, a discrete second electrode (e.g., a discrete cathode) may be arranged for each OLED light-emitting device. For example, as shown in FIG. 8B, a part of the second electrode layer 15 is arranged on the pixel definition layer 13, and the second hollow-out regions 150 are arranged on the pixel definition layer 13 to separate the second electrodes of the plurality of OLED light-emitting devices from one another while allowing the photosensitive fingerprint sensors 19 to receive the light reflected back from the first side of the OLED display panel. However, the present disclosure is not limited thereto. A person skilled in the art may configure the respective structures of the first electrode layer and the second electrode layer according to the display requirement of the display panel, as long as it is ensured that the light reflected back from the first side of the OLED display panel can be received by the plurality of photosensitive fingerprint sensors 19 at positions corresponding to the plurality of light-transmitting holes 170 with a relatively small loss.

Furthermore, referring to FIG. 4, the OLED display panel further includes an over-coating layer 71 covering the black matrix 17 and the color filter layer 18.

In some embodiments of the present disclosure, a material of the first electrode layer 12 is a light-blocking and conductive material.

For example, the first electrode layer 12 may be made of a metal material such as copper, silver, aluminum or the like. As the first electrode layer 12 is configured to be made of the light-blocking and conductive material, light rays emitted by the electroluminescent layers 14 can be prevented from being directly received by the photosensitive fingerprint sensors 19, thereby improving the accuracy of the fingerprint recognition.

In some embodiments of the present disclosure, referring to FIG. 5, the color filter layer 18 includes red color filters 181, green color filters 182 and blue color filters 183 which are spaced apart from one another by the black matrix 17 and arranged in an array. As shown in FIG. 5, in the present disclosure, the plurality of light-transmitting holes 170 are arranged in the black matrix 17. The plurality of photosensitive fingerprint sensors 19 are arranged on the second side of the base plate according to the detection accuracy and the detection area, and based on this, a corresponding number of light-transmitting holes and second hollow-out regions 150 are arranged in the black matrix 17 and the second electrode layer (e.g., the anode layer) 15, respectively. For example, as shown in FIG. 8, the plurality of light-transmitting holes 170 are arranged in the black matrix 17, and these holes 170 may be arranged in an array. Accordingly, as shown in FIGS. 6A, 6B and 7, the plurality of first hollow-out regions and the plurality of second hollow-out regions corresponding to the plurality of light-transmitting holes may be arranged in the first electrode layer and the second electrode layer, respectively. Similarly, the plurality of first hollow-out regions and the plurality of second hollow-out regions are also arranged in arrays.

Of course, based on the foregoing embodiments, the OLED display panel provided in some embodiments of the present disclosure may further include a polarizer, a touch functional layer and the like, which are not limited in the present disclosure.

Figure 9:
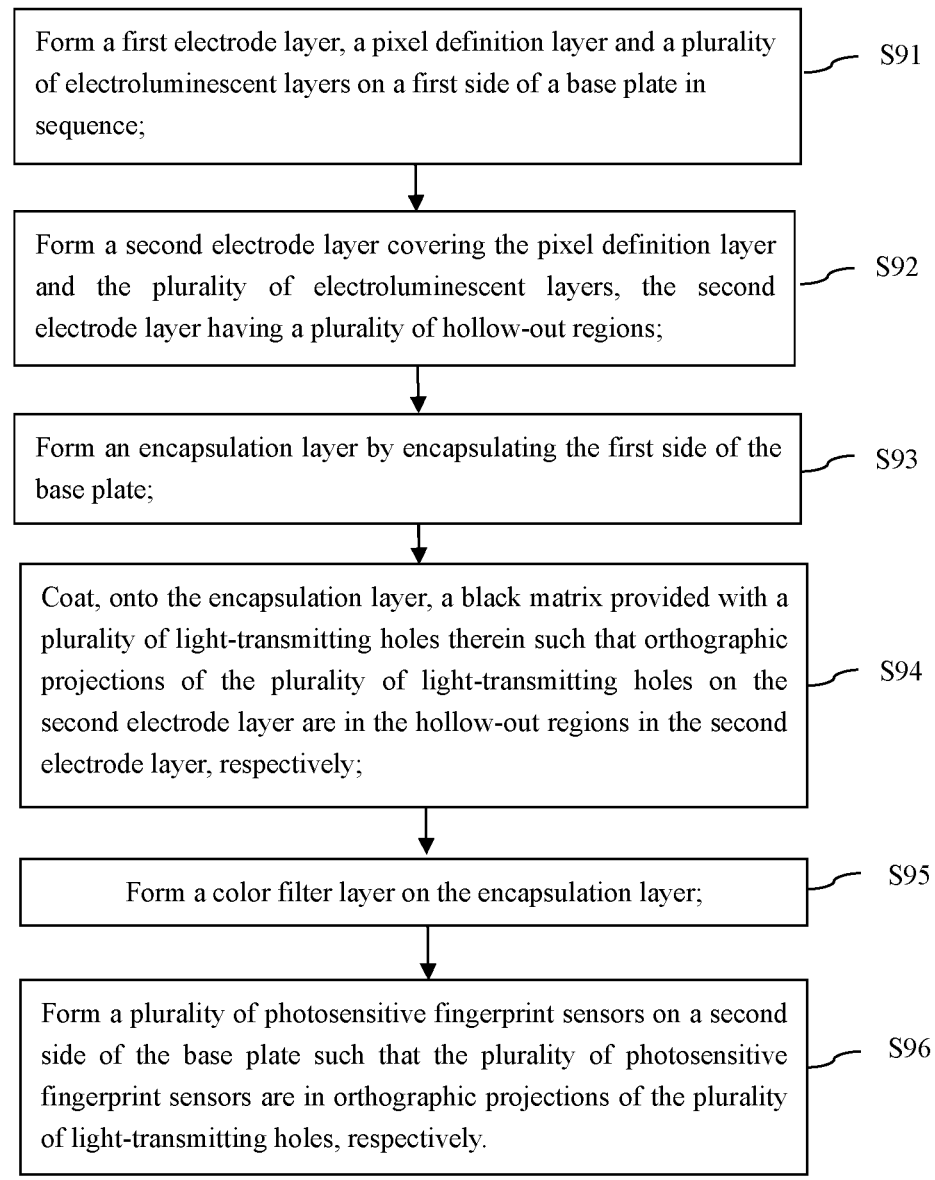
FIG. 9 is a flow chart of a manufacturing method of an OLED display panel provided in some embodiments of the present disclosure.

Based on the same incentive concept, some embodiments of the present disclosure further provide a manufacturing method of an OLED display panel, which is used to manufacture the OLED display panel provided in any embodiment as described above. Specifically, referring to FIG. 9, the manufacturing method of the OLED display panel provided in the embodiments of the present disclosure includes the steps as follows:

forming an OLED device layer on a first side of a base plate, including the steps as follows:

S91: Forming a first electrode layer, a pixel definition layer and a plurality of electroluminescent layers on the first side of the base plate in sequence.

Specifically, the implementation process of the step S91 (that is, forming the first electrode layer, the pixel definition layer and the plurality of electroluminescent layers on the first side of the base plate in sequence) includes the following steps a to c:

Step a: Forming the first electrode layer by evaporating a light-blocking and conductive material in an effective display region.

Step b: Forming the pixel definition layer in a pixel definition region on the first side of the base plate to expose a part of the first electrode layer.

It is to be noted that, in the embodiments of the present disclosure, the OLED display panel is divided into the effective display region and the pixel definition region, wherein the effective display region corresponds to respective regions in which a plurality of sub-pixels are situated, and the pixel definition region corresponds to a region in which the pixel definition layer is situated. The pixel definition layer divides the display panel into a plurality of sub-pixel regions arranged in an array to accommodate a plurality of OLED light-emitting devices, respectively, and the collection of all the sub-pixel regions is the effective display region.

Step c: Forming the plurality of electroluminescent layers of the plurality of OLED light-emitting devices on the part of the first electrode layer that has been exposed.

Particularly, the plurality of electroluminescent layers may be formed on the first electrode layer by a deposition process.

Figure 10:
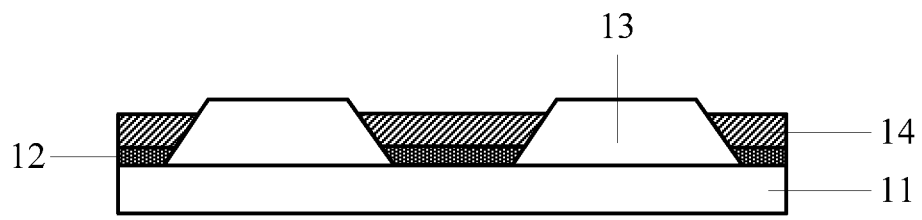
FIG. 10 is a schematic view of an intermediate structure obtained in a manufacturing method of an OLED display panel provided in some embodiments of the present disclosure.

After the forming the first electrode layer, the pixel definition layer and the plurality of electroluminescent layers on the first side of the base plate in sequence, the layered structure thus formed, as shown in FIG. 10, may include the base plate 11, the first electrode layer 12 and the pixel definition layer 13 arranged on the first side of the base plate 11, and the plurality of electroluminescent layers 14 arranged on the first electrode layer 12.

S92: Forming a second electrode layer covering the pixel definition layer and the plurality of electroluminescent layers, the second electrode layer including a plurality of second hollow-out regions.

Figure 11:
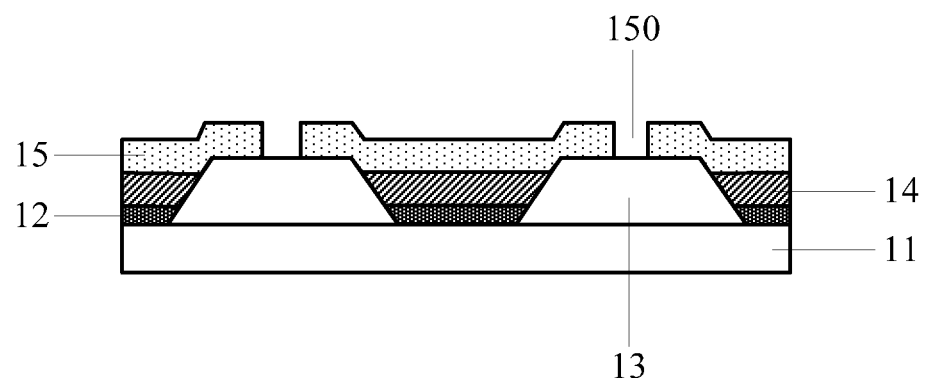
FIG. 11 is a schematic view of an intermediate structure obtained in a manufacturing method of an OLED display panel provided in some embodiments of the present disclosure.

After the forming the second electrode layer covering the pixel definition layer and the plurality of electroluminescent layers, the layered structure thus formed, as shown in FIG. 11, may include the base plate 11, the first electrode layer 12 and the pixel definition layer 13 arranged on the first side of the base plate 11, the plurality of electroluminescent layers 14 arranged on the first electrode layer 12, and the second electrode layer 15 covering the pixel definition layer 13 and the plurality of electroluminescent layers 14. In this way, the manufacturing of the OLED device layer is completed, and the OLED device layer includes the plurality of OLED light-emitting devices.

Particularly, the implementation process of the step S92 (forming the second electrode layer covering the pixel definition layer and the plurality of electroluminescent layers) may include the following steps 1 and 2:

Step 1: Forming, on the pixel definition layer, a plurality of weak bonding layers (e.g., a plurality of transparent organic material layers 31) respectively corresponding to the plurality of second hollow-out regions in the second electrode layer by evaporating a weak bonding material (e.g., a transparent organic material).

Step 2: Forming the second electrode layer in other regions outside the plurality of transparent organic material layers 31 by evaporating a metal material of the second electrode layer (e.g., Mg, AL or their alloy).

Since the metal material of the second electrode layer does not adhere to the weak bonding material, the second electrode layer having the second hollow-out regions may be formed directly after the forming the weak bonding layers corresponding to the second hollow-out regions in the second electrode layer, such that the second hollow-out regions are filled with the transparent organic metal material, thereby ensuring that light rays reflected by a finger can pass through the second electrode layer and be further incident on and received by a plurality of photosensitive fingerprint sensors 19 on a second side of the base plate.

Figure 12:
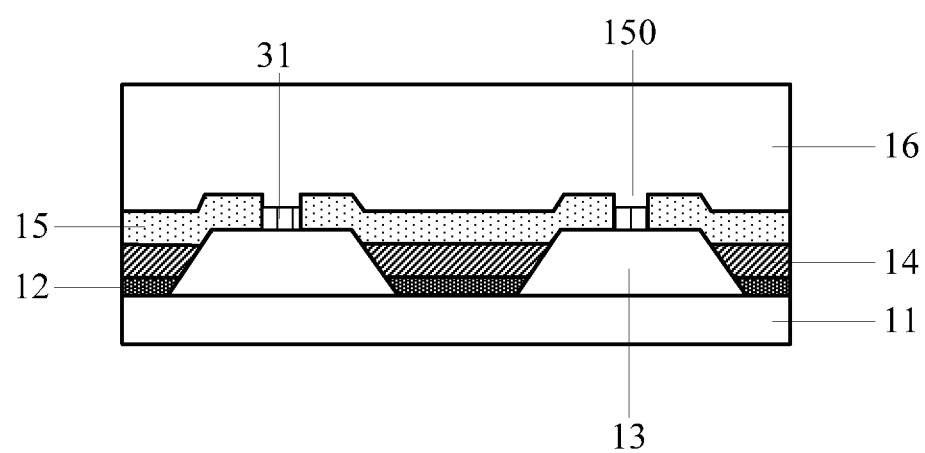
FIG. 12 is a schematic view of an intermediate structure obtained in a manufacturing method of an OLED display panel provided in some embodiments of the present disclosure.

After the second electrode layer covering the pixel definition layer and the plurality of electroluminescent layers are formed through the steps 1 and 2, the layered structure thus formed, as shown in in FIG. 12, may include the base plate 11, the first electrode layer 12 and the pixel definition layer 13 arranged on the first side of the base plate 11, the plurality of electroluminescent layers 14 arranged on the first electrode layer 12, the second electrode layer 15 covering the pixel definition layer 13 and the plurality of electroluminescent layers 14 and having the second hollow-out regions 150, and the transparent organic material layers 31 whose pattern is complementary to the second hollow-out regions 150 in the second electrode layer 15 and situated on the pixel definition layer 13.

S93: Forming an encapsulation layer to encapsulate the first side of the base plate.

Figure 13:
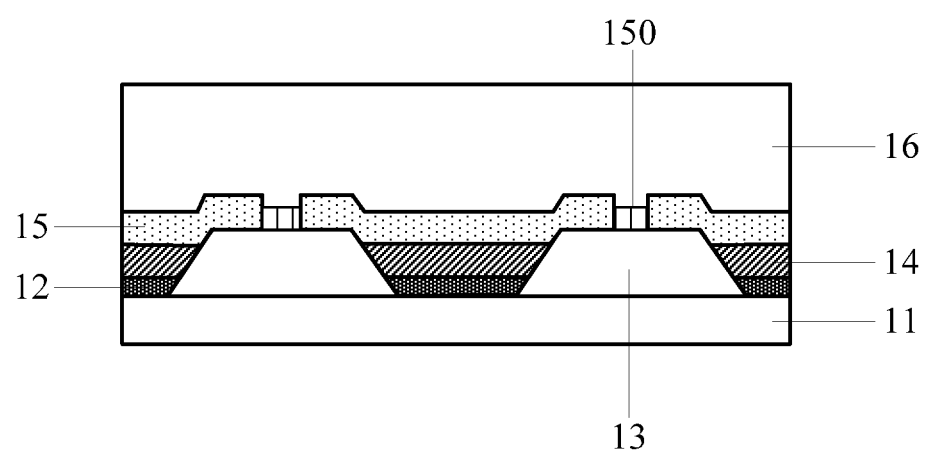
FIG. 13 is a schematic view of an intermediate structure obtained in a manufacturing method of an OLED display panel provided in some embodiments of the present disclosure.

After the forming the encapsulation layer to encapsulate the first side of the base plate, the layered structure thus formed, as shown in FIG. 13, may include the base plate 11, the first electrode layer 12 and the pixel definition layer 13 arranged on the first side of the base plate 11, the plurality of electroluminescent layers 14 arranged on the first electrode layer 12, the second electrode layer 15 covering the pixel definition layer 13 and the plurality of electroluminescent layers 14, and the encapsulation layer 16 covering the second electrode layer 15.

S94: Coating, onto the encapsulation layer, a black matrix provided with a plurality of light-transmitting holes therein such that orthographic projections of the plurality of light-transmitting holes on the second electrode layer are in the second hollow-out regions in the second electrode layer, respectively.

Figure 14:
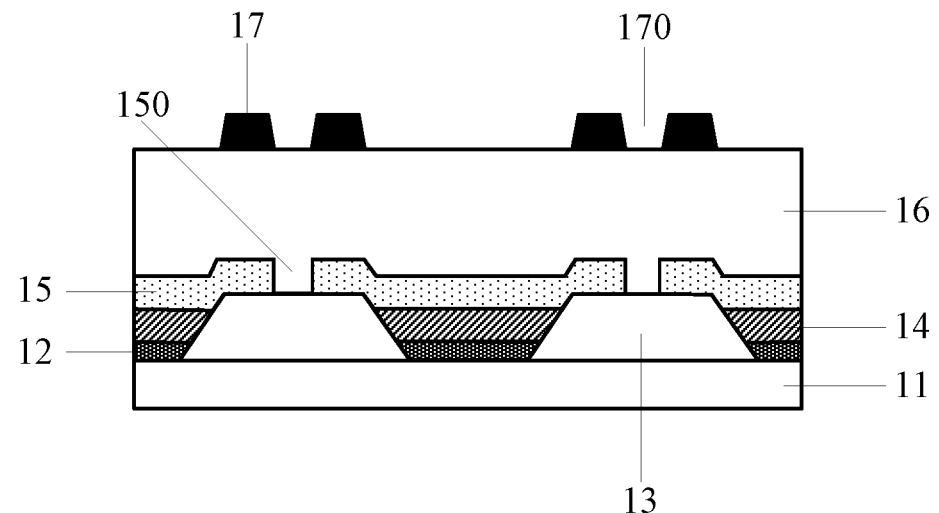
FIG. 14 is a schematic view of an intermediate structure obtained in a manufacturing method of an OLED display panel provided in some embodiments of the present disclosure.

After the coating the black matrix provided with the plurality of light-transmitting holes onto the encapsulation layer such that the orthographic projections of the plurality of light-transmitting holes on the second electrode layer are in the second hollow-out regions in the second electrode layer, respectively, the layered structure thus formed, as shown in FIG. 14, may include the base plate 11, the first electrode layer 12 and the pixel definition layer 13 arranged on the first side of the base plate 11, the plurality of electroluminescent layers 14 arranged on the first electrode layer 12, the second electrode layer 15 covering the pixel definition layer 13 and the plurality of electroluminescent layers 14, the encapsulation layer 16 covering the second electrode layer 15 and the black matrix 17 arranged on the encapsulation layer 16. The plurality of light-transmitting holes 170 are arranged in the black matrix 17, and their orthographic projections on the second electrode layer 15 are in the second hollow-out regions 150, respectively.

S95: Forming a color filter layer on the encapsulation layer.

Specifically, the color filter layer in the embodiments of the present disclosure may include red color filters, green color filters and blue color filters spaced apart from one another by the black matrix and arranged in an array.

When the color filter layer includes the red color filters, the green color filters and the blue color filters spaced apart from one another by the black matrix and arranged in the array, the manufacturing the color filter layer on the encapsulation layer includes:

forming the red color filters, the green color filters and the blue color filters sequentially.

Figure 15:
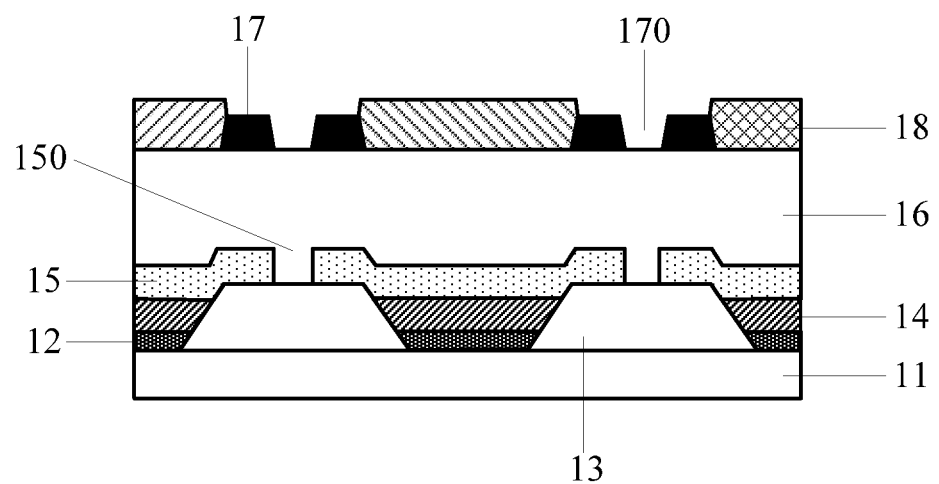
FIG. 15 is a schematic view of an intermediate structure obtained in a manufacturing method of an OLED display panel provided in some embodiments of the present disclosure.

After the forming the color filter layer on the encapsulation layer, the layered structure thus formed, as shown in FIG. 15, may include the base plate 11, the first electrode layer 12 and the pixel definition layer 13 arranged on the first side of the base plate 11, the plurality of electroluminescent layers 14 arranged on the first electrode layer 12, the second electrode layer 15 covering the pixel definition layer 13 and the plurality of electroluminescent layers 14, the encapsulation layer 16 covering the second electrode layer 15, and the black matrix 17 and the color filter layer 18 arranged on the encapsulation layer 16.

The plurality of light-transmitting holes 170 are arranged in the black matrix 17, the second electrode layer 15 has the second hollow-out regions 150, and the orthographic projections of the plurality of light-transmitting holes 170 on the second electrode layer 15 are in the second hollow-out regions 150, respectively.

S96: Forming the plurality of photosensitive fingerprint sensors on the second side of the base plate such that the plurality of photosensitive fingerprint sensors are in orthographic projections of the plurality of light-transmitting holes, respectively.

Figure 16:
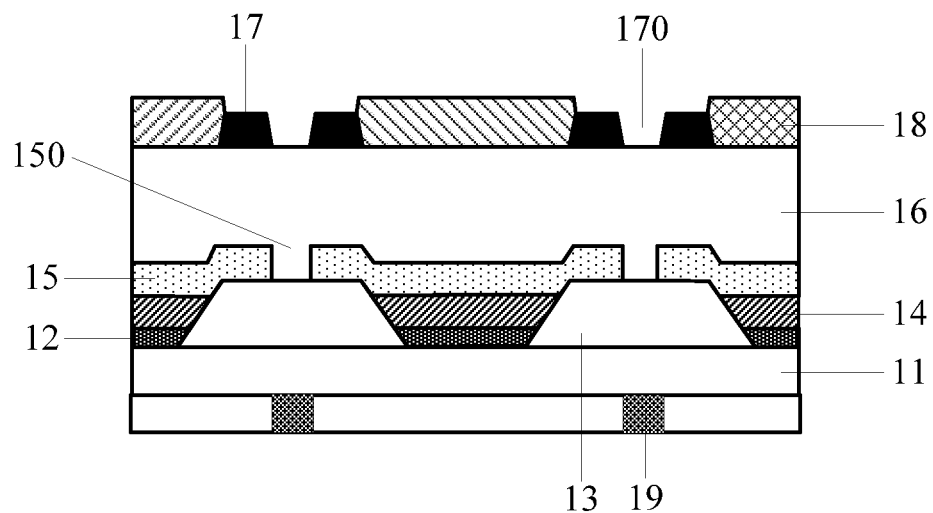
FIG. 16 is a schematic view of an intermediate structure obtained in a manufacturing method of an OLED display panel provided in some embodiments of the present disclosure.

After the forming the plurality of photosensitive fingerprint sensors on the second side of the base plate, the layered structure thus formed, as shown in FIG. 16, may include the base plate 11, the first electrode layer 12 and the pixel definition layer 13 arranged on the first side of the base plate 11, the plurality of electroluminescent layers 14 arranged on the first electrode layer 12, the second electrode layer 15 covering the pixel definition layer 13 and the plurality of electroluminescent layers 14, the encapsulation layer 16 covering the second electrode layer 15, the black matrix 17 and the color filter layer 18 arranged on the encapsulation layer 16, and the plurality of photosensitive fingerprint sensors 19 arranged on the second side of the base plate 11.

The plurality of light-transmitting holes 170 are arranged in the black matrix 17, the second electrode layer 15 has the second hollow-out regions 150, the orthographic projections of the plurality of light-transmitting holes 170 on the second electrode layer 15 are in the second hollow-out regions 150, respectively, and the plurality of photosensitive fingerprint sensors 19 are in the orthographic projections of the plurality of light-transmitting holes 170, respectively.

It is to be noted that, the order of forming the structure on the first side of the base plate and the structure on the second side thereof is not limited in the embodiments of the present disclosure; the structure on the first side of the base plate may be first manufactured through the steps S91 to S95 and the structure on the second side thereof may then be manufactured through the step S96, or vice versa; alternatively, the step S96 may be interposed between any two adjacent steps of the steps S91 to S95.

In one embodiment, after the step S95 (forming the color filter layer on the encapsulation layer), the manufacturing method of the OLED display panel provided in the embodiments of the present application further includes:

forming an over-coating layer covering the color filter layer and the black matrix.

The OLED display panel provided in any embodiment as described above may be manufactured and obtained by the manufacturing method of the OLED display panel provided in the embodiments of the present disclosure, and therefore, the technical effects achieved by said method are the same as those achieved by the OLED display panel provided in any embodiments as described above and will not be repeated herein.

Based on the same inventive concept, some embodiments of the present disclosure further provide a display apparatus. The display apparatus includes the OLED display panel provided in any embodiment described above or the OLED display panel manufactured by the manufacturing method of the OLED display panel provided in the embodiments described above.

For example, an electronic apparatus in the embodiments of the present disclosure may be a mobile phone, a portable android device (PAD), a smart watch, a vehicle-mounted apparatus or the like.

Finally, it is to be noted that various embodiments described above are solely used to illustrate the technical solutions of the present disclosure, but are not intended to limit them; although the present disclosure has been explained in detail with reference to various embodiments described above, a person skilled in the art should understand that it is still possible to modify the technical solutions described in the foregoing embodiments or to modify or substitute part of or all technical features thereof with equivalents, and these modifications and substitutions do not make the corresponding technical solutions deviate from the nature and scope of the technical solutions described in various embodiments of the present disclosure.

The invention claimed is:

1. An OLED display panel, comprising:
a base plate;
an OLED device layer on a first side of the base plate and comprising a plurality of OLED light-emitting devices;
an encapsulation layer which covers the plurality of OLED light-emitting devices; and
a color filter layer which is arranged on the encapsulation layer and comprises: a black matrix defining a plurality of openings, and a plurality of color filters in the plurality of openings, respectively, spaced apart from one another by the black matrix and corresponding to the plurality of OLED light-emitting devices, respectively,
wherein the OLED device layer comprises a first electrode layer, a plurality of electroluminescent layers of the plurality of OLED light-emitting devices on the first electrode layer, and a second electrode layer covering the plurality of electroluminescent layers, and wherein the encapsulation layer is formed on the second electrode layer;
the OLED display panel further comprises a plurality of photosensitive fingerprint sensors arranged on a second side of the base plate opposite to the first side of the base plate; and
the black matrix is provided with a plurality of light-transmitting holes, the second electrode layer is provided with a plurality of second hollow-out regions, and respective orthographic projections of the plurality of light-transmitting holes, the plurality of second hollow-out regions and the plurality of photosensitive fingerprint sensors on the base plate at least partially overlap with one another;
wherein a material of the second electrode layer is magnesium, aluminum and an alloy of magnesium and aluminum; and
the OLED device layer further comprises a plurality of transparent organic material layers which are arranged in the plurality of second hollow-out regions of the second electrode layer, respectively.

2. The OLED display panel according to claim 1, wherein the OLED device layer further comprises a pixel definition layer defining a plurality of sub-pixel regions of the plurality of OLED light-emitting devices and exposing the first electrode layer, and respective orthographic projections of the plurality of second hollow-out regions on the base plate are in an orthographic projection of the pixel definition layer on the base plate.

3. The OLED display panel according to claim 1, wherein orthographic projections of the plurality of transparent organic material layers on the base plate coincide with the orthographic projections of the plurality of second hollow-out regions on the base plate, respectively.

4. The OLED display panel according to claim 3, wherein the first electrode layer comprises a plurality of discrete first electrodes of the plurality of OLED light-emitting devices; and
the second electrode layer comprises a one-piece second electrode for the plurality of OLED light-emitting devices, and the plurality of second hollow-out regions are a plurality of openings arranged in the second electrode layer.

5. The OLED display panel according to claim 1, wherein the first electrode layer has a plurality of first hollow-out regions, and respective orthographic projections of the plurality of light-transmitting holes, the plurality of second hollow-out regions, the plurality of first hollow-out regions and the plurality of photosensitive fingerprint sensors on the base plate at least partially overlap with one another.

6. The OLED display panel according to claim 5, further comprising:
an over-coating layer which covers the color filter layer.

7. The OLED display panel according to claim 6, wherein a material of the first electrode layer comprises a light-blocking and conductive material.

8. The OLED display panel according to claim 7, wherein the color filter layer comprises a plurality of red color filters, a plurality of green color filters and a plurality of blue color filters which are arranged in an array.

9. The OLED display panel according to claim 1, wherein the first electrode layer comprises a plurality of discrete first electrodes of the plurality of OLED light-emitting devices; and the second electrode layer comprises a one-piece second electrode for the plurality of OLED light-emitting devices, and the plurality of second hollow-out regions are a plurality of openings arranged in the second electrode layer.

10. The OLED display panel according to claim 2, wherein
the first electrode layer comprises a plurality of discrete first electrodes of the plurality of OLED light-emitting devices; and
the second electrode layer comprises a one-piece second electrode for the plurality of OLED light-emitting devices, and the plurality of second hollow-out regions are a plurality of openings arranged in the second electrode layer.

11. The OLED display panel according to claim 1, further comprising:
an over-coating layer which covers the color filter layer.

12. A manufacturing method of an OLED display panel, comprising:
forming, on a first side of a base plate, an OLED device layer which has a plurality of OLED light-emitting devices and comprises a first electrode layer, a plurality of electroluminescent layers of the plurality of OLED light-emitting devices on the first electrode layer and a second electrode layer on the plurality of electroluminescent layers, wherein the second electrode layer has a plurality of second hollow-out regions;
forming an encapsulation layer to encapsulate the first side of the base plate and cover the plurality of OLED light-emitting devices;
forming, on the encapsulation layer, a color filter layer which comprises: a black matrix defining a plurality of openings, and a plurality of color filters in the plurality of openings, respectively, spaced apart from one another by the black matrix and corresponding to the plurality of OLED light-emitting devices, respectively, wherein a plurality of light-transmitting holes are arranged in the black matrix; and
forming a plurality of photosensitive fingerprint sensors on a second side of the base plate,
wherein respective orthographic projections of the plurality of light-transmitting holes, the plurality of second hollow-out regions and the plurality of photosensitive fingerprint sensors on the base plate at least partially overlap with one another;
wherein the forming the OLED device layer on the first side of the base plate comprises:
forming, on the base plate, the first electrode layer which comprises a plurality of discrete first electrodes for the plurality of OLED light-emitting devices;
forming, on the plurality of discrete first electrodes, a pixel definition layer to define a plurality of sub-pixel regions of the plurality of OLED light-emitting devices and expose the plurality of discrete first electrodes;
forming the plurality of electroluminescent layers on the plurality of discrete first electrodes; and
forming the second electrode layer on the pixel definition layer and the plurality of electroluminescent layers such that respective orthographic projections of the plurality of second hollow-out regions of the second electrode layer on the base plate are in an orthographic projection of the pixel definition layer on the base plate; and
wherein the forming the second electrode layer on the pixel definition layer and the plurality of electroluminescent layers comprises:
forming a plurality of transparent organic material layers at respective positions corresponding to the plurality of second hollow-out regions on the pixel definition layer, respectively; and
forming a second electrode material layer on the pixel definition layer and the plurality of electroluminescent layers to form the second electrode layer which comprises the plurality of transparent organic material layers at the respective positions corresponding to the plurality of second hollow-out regions and a second electrode material outside the respective positions corresponding to the plurality of second hollow-out regions.

13. The manufacturing method according to claim 12, wherein
the forming the first electrode layer on the base plate comprises: forming the first electrode layer having a plurality of first hollow-out regions, such that respective orthographic projections of the plurality of light-transmitting holes, the plurality of second hollow-out regions, the plurality of first hollow-out regions and the plurality of photosensitive fingerprint sensors on the base plate at least partially overlap with one another.

14. The manufacturing method according to claim 13, wherein after the forming the color filter layer on the encapsulation layer, the manufacturing method further comprises:
forming an over-coating layer on the color filter layer.

15. The manufacturing method according to claim 12, wherein a material of the second electrode is magnesium, aluminum and an alloy of magnesium and aluminum.

\* \* \* \* \*